United States Patent
Nagar et al.

(10) Patent No.: US 6,891,392 B2
(45) Date of Patent: May 10, 2005

(54) SUBSTRATE IMPEDANCE MEASUREMENT

(75) Inventors: Mohan R. Nagar, Milpitas, CA (US); Aritharan Thurairajaratnam, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 11 days.

(21) Appl. No.: 10/371,386

(22) Filed: Feb. 21, 2003

(65) Prior Publication Data

US 2004/0164758 A1 Aug. 26, 2004

(51) Int. Cl.[7] .......................... G01R 31/26; H01H 31/02
(52) U.S. Cl. ........................................ 324/765; 324/537
(58) Field of Search ................................ 324/532–535, 324/637–646, 754, 758, 761–762; 438/14–17

(56) References Cited

U.S. PATENT DOCUMENTS

| 3,525,937 | A | * | 8/1970 | Mozer ........................ 324/72.5 |
| 4,766,386 | A | * | 8/1988 | Oliver et al. ................ 324/533 |
| 4,866,302 | A | * | 9/1989 | Whiteley et al. ............. 257/31 |
| 5,394,100 | A | * | 2/1995 | Bohler et al. ................ 324/758 |
| 5,633,801 | A |   | 5/1997 | Bottman |
| 5,726,578 | A | * | 3/1998 | Hook .......................... 324/643 |
| 5,823,790 | A |   | 10/1998 | Magnuson |
| 5,949,245 | A |   | 9/1999 | Liu |
| 6,051,978 | A | * | 4/2000 | Swart .......................... 324/537 |
| 6,218,848 | B1 |   | 4/2001 | Hembree et al. |
| 6,281,694 | B1 |   | 8/2001 | Tsai |
| 6,404,212 | B1 | * | 6/2002 | Mehta et al. ................ 324/754 |
| 6,501,278 | B1 | * | 12/2002 | Arabi .......................... 324/533 |
| 6,535,006 | B2 |   | 3/2003 | Shahriari et al. |
| 6,590,409 | B1 | * | 7/2003 | Hsiung et al. ............... 324/765 |
| 6,605,954 | B1 | * | 8/2003 | Nagar .......................... 324/755 |
| 6,632,534 | B2 | * | 10/2003 | Skaling et al. ............... 324/534 |
| 6,759,853 | B2 | * | 7/2004 | Butler .......................... 324/754 |
| 2002/0143486 | A1 |   | 10/2002 | Jain et al. |
| 2003/0030453 | A1 |   | 2/2003 | Mayder et al. |
| 2003/0078748 | A1 |   | 4/2003 | Ayadi |
| 2003/0085722 | A1 |   | 5/2003 | Rutten |

FOREIGN PATENT DOCUMENTS

JP 2002-148291 5/2002

* cited by examiner

Primary Examiner—Evan Pert
Assistant Examiner—Jermele Hollington
(74) Attorney, Agent, or Firm—Luedeka, Neely & Graham, P.C.

(57) ABSTRACT

A probe structure for testing impedance of a package substrate using time domain reflectometry. A connector electrically connects the probe structure to a time domain reflectometry tester, where the connector has a signal conductor and a ground conductor. An electrically conductive cantilever signal pin is electrically connected to the signal conductor. The electrically conductive cantilever signal pin has a tip for making an electrical connection with an electrically conductive structure to be tested on the package substrate. The electrically conductive cantilever signal pin is electrically isolated by and sheathed within a ground shield that is electrically connected to at least one of the ground conductor and electrically conductive cantilever ground pins. The electrically conductive cantilever ground pins are electrically connected to the ground conductor. The electrically conductive cantilever ground pins also have tips, for making electrical connections with electrically conductive structures on the package substrate that surround the electrically conductive structure to be tested on the package substrate.

20 Claims, 2 Drawing Sheets

SUBSTRATE IMPEDANCE MEASUREMENT

FIELD

This invention relates to the field of integrated circuit fabrication. More particularly, this invention relates to testing the characteristic impedance of integrated circuit package substrates.

BACKGROUND

As integrated circuits become increasingly faster, the structures used for conducting the signals must be fabricated to increasingly tighter tolerances so that they do not degrade or otherwise introduce unwanted characteristics into the signals which they conduct. Even the electrically nonconductive structures can effect the quality of the high speed signals passing through the conductive elements that are nearby. These tighter tolerances are important not only in the fabrication of the integrated circuits themselves, but also for the structures that are used to feed the signals to and from the integrated circuits, such as package components.

Obviously, if the conductive traces in a package substrate have shorts or opens, then the package substrate will function improperly. However, even seemingly minor imperfections can effect signal integrity at high signal speeds. For example, if such conductive traces are not of a uniform thickness and width along the length of the trace, then the impedance of the non uniform trace changes along its length. Thus, discontinuities in printed traces and connectors can degrade signal integrity. In addition, flaws in the non electrically conductive materials can introduce shorts and capacitances. Once problems like these occur, other problems begin to cascade, such as crosstalk, reflections, logic errors, and clock skew.

Time domain reflectometry is a method that is used to discover such problems in structures like integrated circuit package substrates. Time domain reflectometry uses a high speed digitizing oscilloscope with a built in step generator that launches a fast edge into a device under test, such as an electrical trace in a package substrate. By monitoring the reflected wave from various impedance discontinuities encountered in the substrate, different properties of the substrate, such as those mentioned above, can be sensed and analyzed. Time domain reflectometry uncovers such unwanted signal reflections so that defective substrates can be scrapped or reworked, and design flaws and process flaws can be corrected.

However, because time domain reflectometry is a very sensitive process, it is a relatively difficult and time consuming process. Therefore, only a few traces are typically tested on a substrate, because it is cost prohibitive to test a greater number. Therefore, a certain percentage of problems may remain undetected even after time domain reflectometry, because of the relatively few number of traces that are typically tested. Furthermore, in order to obtain tighter tolerances it is important to consider the variations in the entire package substrate.

What is needed, therefore, is a system by which time domain reflectometry can be performed on a greater number of package substrate traces without an extreme increase in time, so that problems with the traces can be detected prior to attachment and test or use of the integrated circuit.

SUMMARY

The above and other needs are met by a probe structure for testing the impedance of a package substrate using time domain reflectometry. A connector electrically connects the probe structure to a time domain reflectometry tester, where the connector has a signal conductor and a ground conductor. An electrically conductive cantilever signal pin is electrically connected to the signal conductor. The electrically conductive cantilever signal pin has a tip for making an electrical connection with an electrically conductive structure to be tested on the package substrate. The electrically conductive cantilever signal pin is electrically isolated by and sheathed within a ground shield that is electrically connected to at least one of the ground conductor and electrically conductive cantilever ground pins. The electrically conductive cantilever ground pins are electrically connected to the ground conductor. The electrically conductive cantilever ground pins also have tips, for making electrical connections with electrically conductive structures on the package substrate that surround the electrically conductive structure to be tested on the package substrate.

In this manner, a single electrical structure on the package substrate, such as an electrical trace, can be probed with the electrically conductive cantilever signal pin, while the electrically conductive cantilever ground pins make contact with the surrounding contacts on the package substrate, where the electrical connections to all of the surrounding contacts are tied together. Thus, the package substrate can be quickly and easily probed, and time domain reflectometry measurements can be readily taken. Once this probe setup is attached to an automatic XYZ positioner, time domain reflectometry measurements can be performed automatically.

This setup improves the accuracy of the measured wave forms due to the ability of the setup to ground the surrounding conductive structures while probing the structure of interest. Further, the shielding of the electrically conductive cantilever signal pin allows for the use of cantilever pins in time domain reflectometry. Typically, cantilever pins are not able to provide the electrical characteristics required for such measurements. Therefore, in the system as described herein, more accurate measurements can be taken in a given amount of time, providing for a more complete investigation of the package substrate and the package substrate design.

In various preferred embodiments, the ground shield of the electrically conductive cantilever signal pin is electrically connected to the electrically conductive cantilever ground pins by an electrically conductive foil disposed at a distance from the tips of the electrically conductive cantilever signal pin and the electrically conductive cantilever ground pins. Preferably, the impedance of the probe structure is adjusted by adjusting the distance from the tips at which the electrically conductive foil is disposed. In a most preferred embodiment, the electrically conductive foil is formed of copper. The probe structure is in one embodiment about eleven millimeters by about eleven millimeters in size.

Preferably, the connector is a fifty ohm subminiature version A connector, and most preferably the electrically conductive cantilever signal pin is electrically connected to a center conductor of the fifty ohm subminiature version A connector, and the electrically conductive cantilever ground pins are electrically connected to an outer conductor of the fifty ohm subminiature version A connector. In one embodiment, the electrically conductive cantilever pins are disposed at a pitch adapted for testing a ball grid array side of the package substrate. In another embodiment, the electrically conductive cantilever pins are disposed at a pitch adapted for testing a solder on pad die side of the package substrate. In various embodiments, the electrically conductive cantilever pins are disposed at a pitch of one of about eight tenths of millimeter, about one millimeter, and about one and twenty-seven hundredths of a millimeter.

According to another aspect of the invention there is described a system for testing impedance of a package substrate using time domain reflectometry. A time domain reflectometry test station is electrically connected to a probe structure via a connector on the probe structure, where the connector has a signal conductor and a ground conductor. An electrically conductive cantilever signal pin is electrically connected to the signal conductor. The electrically conductive cantilever signal pin has a tip for making an electrical connection with an electrically conductive structure to be tested on the package substrate.

The electrically conductive cantilever signal pin is electrically isolated by and sheathed within a ground shield that is electrically connected to at least one of the ground conductor and electrically conductive cantilever ground pins. The electrically conductive cantilever ground pins are electrically connected to the ground conductor. The electrically conductive cantilever ground pins also have tips, for making electrical connections with electrically conductive structures on the package substrate that surround the electrically conductive structure to be tested on the package substrate.

An XYZ stage moves the package substrate under the probe structure and thereby enables the automated testing of multiple electrically conductive structures on the package substrate. A pattern recognition system aligns the electrically conductive pins to the electrically conductive structures on the package substrate.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
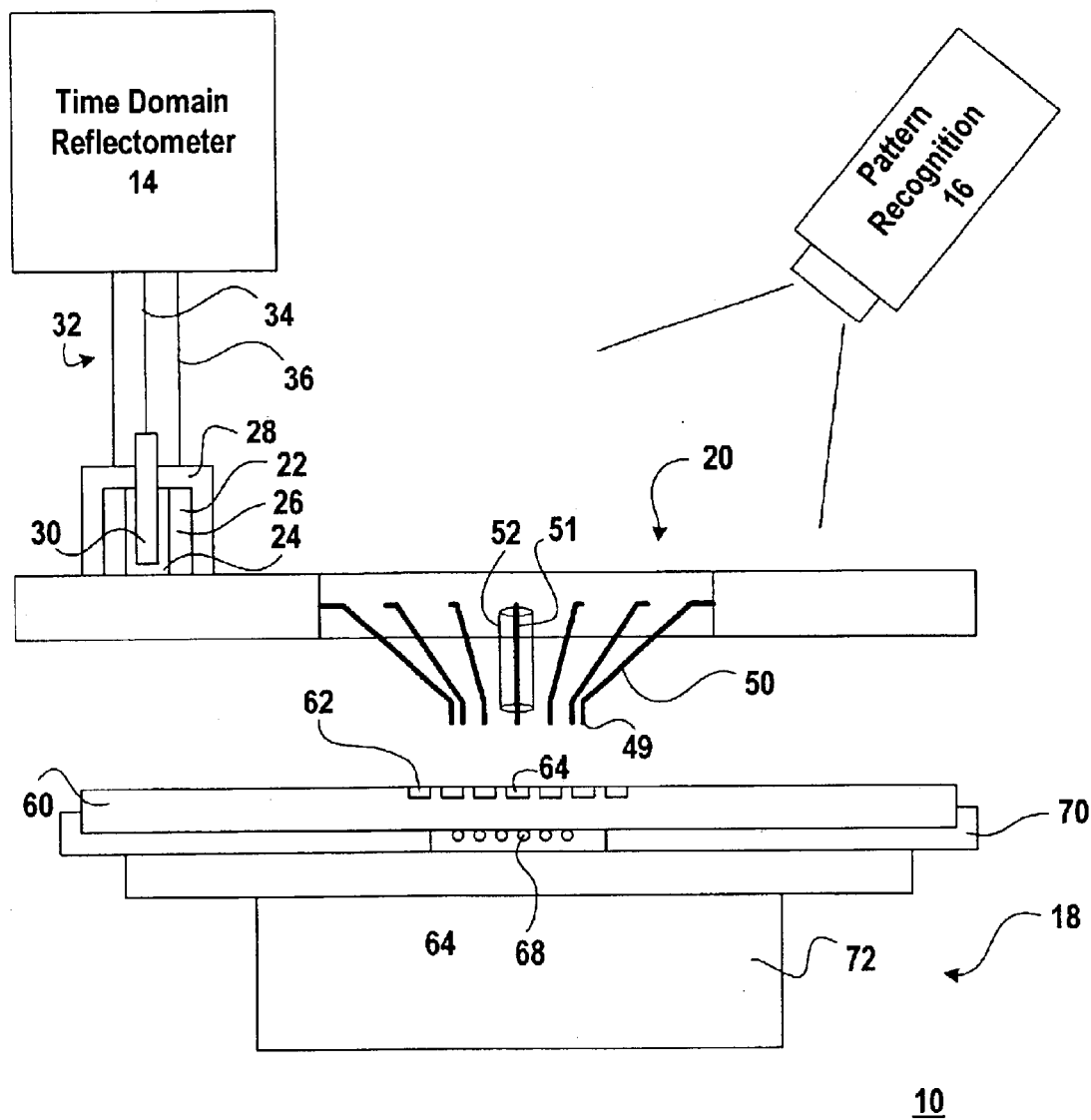
FIG. 1 is a cross sectional view of a probe structure according to the present invention.

With reference now to FIG. 1, there is depicted a cross sectional view of a probe structure 20 according to the present invention, with a functional block diagram of other parts of a system 10 that uses such a probe structure 20. The probe structure 20 is preferably electrically connected to a time domain reflectometer test station 14 via a cable such as a coaxial cable 32, having a center conductor 34 and an outer conductor 36. The coaxial cable 32 is preferably terminated with a connection such as a fifty ohm subminiature version A connector having a center pin 30 electrically connected to the center conductor 34 and a cap 28 electrically connected to the outer conductor 36. This connector is electrically connected to a connector 22 attached to the probe structure 20, having a signal conductor 24 electrically connected to the center pin 30 and a ground conductor 26 electrically connected to the cap 28.

The electrically conductive cantilever signal pin 51 is preferably electrically shielded, such as with a shielding sheath 52, which most preferably enshrouds the electrically conductive cantilever signal pin 51 and protects it from radio frequency and other such interference. The sheath 52 as depicted in FIG. 1 is transparent, so that its physical relationship with the electrically conductive cantilever signal pin 51 can be more easily seen. The sheath 52 is preferably electrically connected to ground via the ground conductor 26, by at least one of two methods. In the first method, the sheath 52 is connected to the ground conductor 26 by an electrically conductive lead 57 as denicted in FIG. 2, that connects to the sheath 52 on one end and the ground conductor 26 on the other. The second method is described in more detail hereafter.

The signal conductor 24 is preferably electrically connected to an electrically conductive cantilever signal pin 51 and the ground conductor 26 is preferably electrically connected to at least one electrically conductive cantilever ground pin 50. As depicted in FIG. 1, there are many electrically conductive cantilever ground pins 50, and in various embodiments there may be fewer than the number so depicted. However, in preferred embodiments there are many more electrically conductive cantilever ground pins 50 than are depicted, and there may be hundreds of such electrically conductive cantilever ground pins 50. However, there is preferably only a single electrically conductive cantilever signal pin 51.

The electrically conductive pins 50 and 51 all have probe tips 49, by which contact is made between the probe structure 20 and the device to be tested, such as package substrate 60. The package substrate 60 has electrically conductive structures 62, such as electrically conductive pads connected to electrically conductive traces. One of the electrically conductive structures 64, or a structure connected to it, is to be tested using the system 10. The structure 64 to be tested is aligned so as to be underneath the electrically conductive cantilever signal pin 51 that is electrically connected to the signal conductor 24. The electrically conductive cantilever ground pins 50 are disposed with a pitch so as to make electrical connections with the surrounding electrical structures 62 on the package substrate 60. Thus, the pitch of the pins 50 may be such as to probe the ball grid array of the package substrate 60, or may alternately be pitched to probe the solder on pad bump side 68 of the package substrate 60. Preferably, the pin 50 pitch is one of about eight tenths of a millimeter, about one millimeter, and about one and twenty-seven hundredths of a millimeter. This pin 50 pitch can be varied to obtain other pin sizes.

The package substrate 60 is preferably held by a substrate holder 70, which is attached to a pedestal 72. These elements represent an XYZ stage 18 that can index the package substrate 60 beneath the probe structure 20, so that different ones of the electrical structures 62 on the surface of the package substrate 60 can be electrically tested with the electrically conductive cantilever signal pin 51. Preferably, such testing and indexing is accomplished automatically under the control of a controller, such as may be included within the time domain reflectometer test station 14.

Most preferably the system 10 also includes a pattern recognition system 16 for aligning the electrically conductive pins 52 to the electrically conductive structures 62 on the package substrate 60, as they are indexed by the XYZ stage 18 under the probe structure 20.

Figure 2:
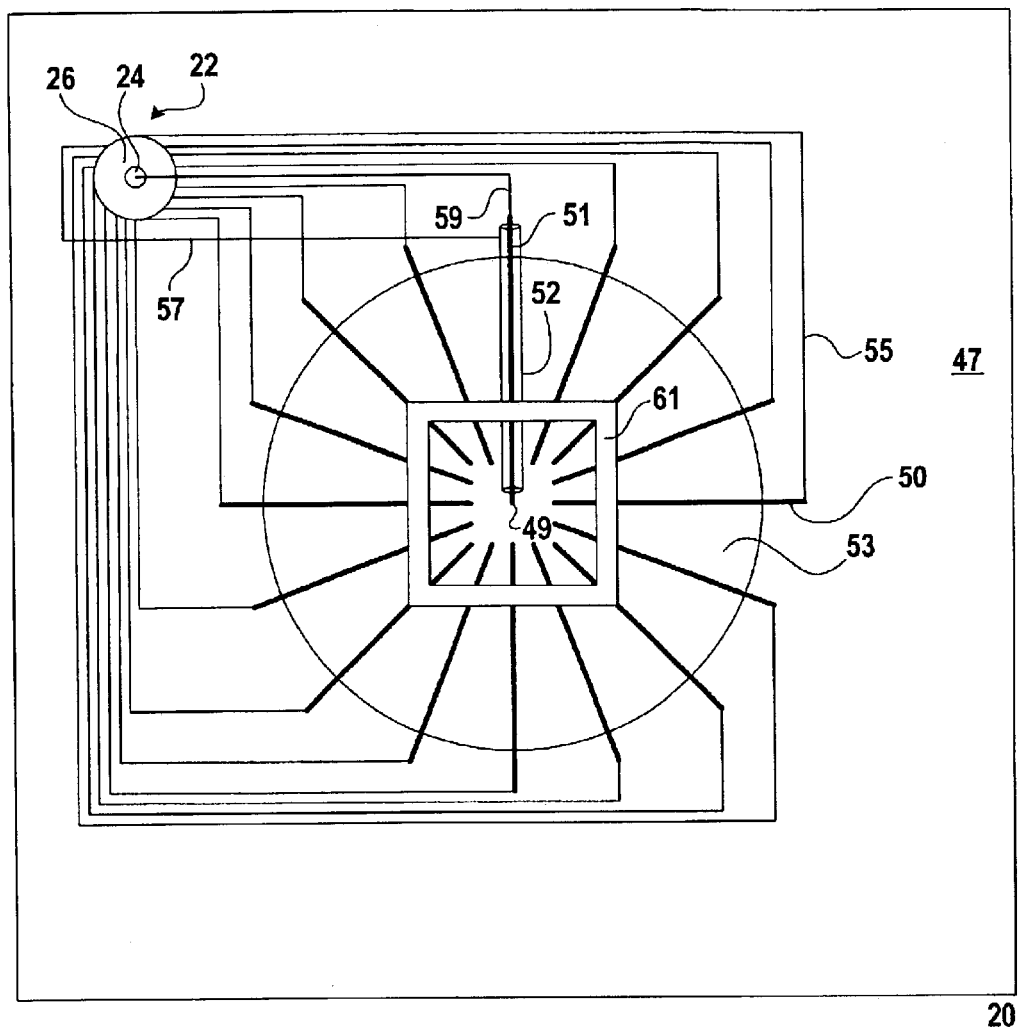
FIG. 2 is a top plan view of the probe structure according to the present invention.

FIG. 2 representationally depicts the probe structure 20 from a top plan view. Depicted is the connector 22, including the signal conductor 24 and the ground conductor 26. It is appreciated that the layout of the electrically conductive cantilever signal pin 51 and ground pins 50 as depicted in FIG. 2 is representational only, and in actual implementation the layout of the electrically conductive cantilever signal pin 51 and ground pins 50 may take one or more of a variety of different forms, preferably dependant at least in part upon the configuration of the electrically conductive structures 62 on the package substrate 60 to be probed. As before, the sheath 52 on the electrically conductive cantilever signal pin 51 is depicted as being transparent, so as to better indicate the physical relationship between the sheath 52 and the electrically conductive cantilever signal pin 51.

The electrically conductive cantilever signal pin 51 is preferably electrically connected to the signal conductor 22 such as by an electrically conductive lead 59, and the electrically conductive cantilever ground pins 50 are preferably electrically connected to the ground conductor 26 such as by electrically conductive leads 55. All of the electrically conductive cantilever pins 50 and 51 are mounted at one end to a platform 47 of the probe structure 20, and their respective distal ends reach through a hole 53 in the platform 47, to extend down toward the device under test. It is appreciated that other configurations of the probe structure are also contemplated, such as electrically conductive cantilever pins 50 and 51 that extend directly out of the platform 47 from around the outside peripheral edge of the hole 53, or electrically conductive cantilever pins 50 and 51 that are mounted on the underside of the platform 47 instead of the top side of the platform 47.

Preferably, there is an electrically conductive foil 61 disposed at a distance from the tips 49 of the electrically conductive cantilever pins 50 and 51, and which preferably makes electrical connections between the grounded sheath 52 of the electrically conductive cantilever signal pin 51 and the electrically conductive cantilever ground pins 50. Most preferably the electrically conductive foil 61 if formed of copper. Thus, the electrically conductive foil 61 is the second method by which the sheath 52 can be electrically connected to the ground conductor 26, as the sheath 52 makes electrical connection to the ground conductor 26 through the electrically conductive cantilever ground pins 50 and the respective electrically conductive traces 55 by which they are electrically connected to the ground conductor 26.

The impedance of the probe structure 20 is preferably adjusted by adjusting the distance from the tips 49 at which the electrically conductive foil 61 is disposed, such as by either increasing or decreasing the distance. The impedance of the probe structure 20 may also be adjusted at the time the probe structure 20 is fabricated, by adjusting the length of the electrically conductive cantilever pins 50 and 51 as desired. Thus, the impedance of the probe structure 20 can be set to a specific level, as is desired when making time reflectometry measurements.

In a preferred embodiment, the probe structure 20 is about eleven millimeters by about eleven millimeters in size. However, it is appreciated that other sizes can be used as well. Further, the number of pins 50 as depicted in FIGS. 1 and 2 is not by way of limitation, but rather is representational only. In addition, the probe structure 20 need not be rectilinear as depicted, but may alternately be formed in another shape, such as circular. As depicted in FIG. 1, the probe structure 20 is roughly the same size as the package substrate 60 to be tested. However, it is appreciated that the probe structure 20 may alternately be either larger than or smaller than the package substrate 60 to be tested.

The system 10 as described allows a signal to be launched to and received from a pad 62 on the package substrate 60 while at the same time grounding the surrounding pads, such as Vss pads, Vdd pads, and other signal pads within a predefined region, to the outer conductor of the fifty ohm coaxial cable connected to the connector 22. Thus, time domain reflectometry measurements are easily and accurately made to determine, for example, the characteristic impedance ($Z_0$) of the traces in the package substrate 60. A discussion of time domain reflectometry is left to other sources.

In this manner, time domain reflectometry measurements may be accomplished using a probe structure 20 with cantilever pins, whereas such structures are typically inadequate for such measurements. One reason that the structure as described above can be used for such measurements is that the impedance can be adjusted by moving the foil connections on the pins 50 and 51 either closer to or farther from the tips 49. Another reason that the structure as described above can be used for such measurements is that the electrically conductive cantilever signal pin 51 is electrically shielded by use of the sheath 52, which reduces and preferably eliminates the interference that a cantilever pin would typically be subject to, and which tends to disrupt the sensitive time domain reflectometry measurement.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A probe structure for testing impedance of a package substrate using time domain reflectometry, the probe structure comprising:

a connector for electrically connecting the probe structure to a time domain reflectometry tester, the connector having a signal conductor and a ground conductor, an electrically conductive cantilever signal pin electrically connected to the signal conductor, the electrically conductive cantilever signal pin having a tip for making an electrical connection with an electrically conductive structure to be tested on the package substrate, the electrically conductive cantilever signal pin electrically isolated by and sheathed within a ground shield that is electrically connected to at least one of the ground conductor and electrically conductive cantilever ground pins, where the around shield is disposed coaxially along substantially an entire length of the signal pin with just the tip of the signal in extending from the around shield, and the electrically conductive cantilever ground pins electrically connected to the ground conductor, the electrically conductive cantilever ground pins having tips for making electrical connections with electrically conductive structures on the package substrate that surround the electrically conductive structure to be tested on the package substrate.

2. The probe structure of claim 1, wherein the ground shield of the electrically conductive cantilever signal pin is electrically connected to the electrically conductive cantilever ground pins by an electrically conductive foil disposed at a distance from the tips of the electrically conductive cantilever signal pin and the electrically conductive cantilever ground pins.

3. The probe structure of claim 2, wherein the impedance of the probe structure is adjusted by adjusting the distance from the tips at which the electrically conductive foil is disposed.

4. The probe structure of claim 2, wherein the electrically conductive foil is formed of copper.

5. The probe structure of claim 1, wherein the probe structure is about eleven millimeters by about eleven millimeters in size.

6. The probe structure of claim 1, wherein the connector is a fifty ohm subminiature version A connector.

7. The probe structure of claim 1, wherein the connector is a fifty ohm subminiature version A connector, the electrically conductive cantilever signal pin is electrically connected to a center conductor of the fifty ohm subminiature version A connector, and the electrically conductive cantilever ground pins are electrically connected to an outer conductor of the fifty ohm subminiature version A connector.

8. The probe structure of claim 1, wherein the electrically conductive cantilever pins are disposed at a pitch adapted for testing a ball grid array side of the package substrate.

9. The probe structure of claim 1, wherein the electrically conductive cantilever pins are disposed at a pitch adapted for testing a solder on pad die side of the package substrate.

10. The probe structure of claim 1, wherein the electrically conductive cantilever pins are disposed at a pitch of one of about eight tenths of millimeter, about one millimeter, and about one and twenty-seven hundredths of a millimeter.

11. A system for testing impedance of a package substrate using time domain reflectometry, the system comprising:
a time domain reflectometry test station electrically connected to a probe structure, and
the probe structure having,
a connector for electrically connecting the probe structure to a time domain reflectometry tester, the connector having a signal conductor and a ground conductor,
an electrically conductive cantilever signal pin electrically connected to the signal conductor, the electrically conductive cantilever signal pin having a tip for making an electrical connection with an electrically conductive structure to be tested on the package substrate, the electrically conductive cantilever signal pin electrically isolated by and sheathed within a ground shield that is electrically connected to at least one of the ground conductor and electrically conductive cantilever ground pins, where the around shield is disposed coaxially along substantially an entire length of the signal pin with just the tip of the signal pin extending from the around shield, and
the electrically conductive cantilever ground pins electrically connected to the ground conductor, the electrically conductive cantilever ground pins having tips for making electrical connections with electrically conductive structures on the package substrate that surround the electrically conductive structure to be tested on the package substrate.

12. The system of claim 11, further comprising an XYZ stage for moving the package substrate under the probe structure and thereby enabling the automated testing of multiple electrically conductive structures to be tested on the package substrate.

13. The system of claim 11, further comprising a pattern recognition system for aligning the electrically conductive pins to the electrically conductive structures on the package substrate.

14. The system of claim 11, wherein the ground shield of the electrically conductive cantilever signal pin is electrically connected to the electrically conductive cantilever ground pins by an electrically conductive foil disposed at a distance from the tips of the electrically conductive cantilever signal pin and the electrically conductive cantilever ground pins.

15. The system of claim 14, wherein the impedance of the probe structure is adjusted by adjusting the distance from the tips at which the electrically conductive foil is disposed.

16. The system of claim 11, wherein the probe structure is about eleven millimeters by about eleven millimeters in size.

17. The system of claim 11, wherein the electrically conductive cantilever pins are disposed at a pitch adapted for testing a ball grid array side of the package substrate.

18. A system for testing impedance of a package substrate using time domain reflectometry, the system comprising:
a time domain reflectometry test station electrically connected to a probe structure,
the probe structure having,
a connector for electrically connecting the probe structure to a time domain reflectometry tester, the connector having a signal conductor and a ground conductor,
an electrically conductive cantilever signal pin electrically connected to the signal conductor, the electrically conductive cantilever signal pin having a tip for making an electrical connection with an electrically conductive structure to be tested on the package substrate, the electrically conductive cantilever signal pin electrically isolated by and sheathed within a ground shield that is electrically connected to at least one of the ground conductor and electrically conductive cantilever ground pins, where the ground shield is disposed coaxially along substantially an entire length of the signal pin with just the tip of the signal pin extending from the ground shield, and
the electrically conductive cantilever ground pins electrically connected to the ground conductor, the electrically conductive cantilever ground pins having tips for making electrical connections with electrically conductive structures on the package substrate that surround the electrically conductive structure to be tested on the package substrate,
an XYZ stage for moving the package substrate under the probe structure and thereby enabling the automated testing of multiple electrically conductive structures on the package substrate, and
a pattern recognition system for aligning the electrically conductive pins to the electrically conductive structures on the package substrate.

19. The system of claim 18, wherein the ground shield of the electrically conductive cantilever signal pin is electrically connected to the electrically conductive cantilever ground pins by an electrically conductive foil disposed at a distance from the tips of the electrically conductive cantilever signal pin and the electrically conductive cantilever ground pins.

20. The system of claim 19, wherein the impedance of the probe structure is adjusted by adjusting the distance from the tips at which the electrically conductive foil is disposed.

* * * * *